United States Patent
Draxelmayr (10) Patent No.: US 7,724,041 B2
(45) Date of Patent: May 25, 2010

(54) CIRCUIT ARRANGEMENT COMPRISING A SAMPLE-AND-HOLD DEVICE AND METHOD FOR SIGNAL PROCESSING IN A SAMPLE-AND-HOLD DEVICE

(75) Inventor: Dieter Draxelmayr, Villach (AT)

(73) Assignee: Infineon Technologies AG, Neubiberg (DE)

( * ) Notice: Subject to any disclaimer, the term of this patent is extended or adjusted under 35 U.S.C. 154(b) by 342 days.

(21) Appl. No.: 11/729,553

(22) Filed: Mar. 29, 2007

(65) Prior Publication Data

US 2007/0236261 A1 Oct. 11, 2007

(30) Foreign Application Priority Data

Mar. 30, 2006 (DE) .................. 10 2006 014 925

(51) Int. Cl.
*H03K 5/00* (2006.01)
(52) U.S. Cl. .................. 327/91; 327/94; 327/96
(58) Field of Classification Search ............. 327/91–96; 341/122
See application file for complete search history.

(56) References Cited

U.S. PATENT DOCUMENTS

| | | | |
|---|---|---|---|
| 6,617,908 B1* | 9/2003 | Thomsen et al. ............. | 327/337 |
| 6,636,084 B2* | 10/2003 | Sarraj ......................... | 327/95 |
| 6,700,417 B2* | 3/2004 | Kawahito et al. ............. | 327/94 |
| 6,965,258 B2 | 11/2005 | Bogner | |
| 7,397,287 B2* | 7/2008 | Makihara ..................... | 327/91 |

FOREIGN PATENT DOCUMENTS

| CN | 1588304 A | 3/2005 |
|---|---|---|
| JP | 61-224610 A | 10/1986 |

OTHER PUBLICATIONS

"A 14b 100MS/s Digitally Self-Calibrated Pipelined ADC in 0.13μm CMOS", Peter Bogner, Franz Kuttner, Claus Kropf, Thomas Hartig, Markus Burian and Hermann Eul, 2006 IEEE International Solid-State Circuits Conference, Jan. 2006, 3 pgs.

* cited by examiner

*Primary Examiner*—Hai L Nguyen
(74) *Attorney, Agent, or Firm*—Eschweiler & Associates, LLC (57) ABSTRACT

In a circuit arrangement including a sample-and-hold device, the sample-and-hold device includes a first, a second, a third and a fourth charge store, and also a first and a second input terminal for feeding in a differential input signal comprising a first and a second component. A differential output signal is output via a first and a second output terminal. The charge stores are charged with the first or the second component of the differential input signal in a first phase of a time segment. In a second phase of the time segment, the differential output signal is generated in a manner dependent on the charges of the first, second, third and fourth charge stores.

26 Claims, 3 Drawing Sheets

CIRCUIT ARRANGEMENT COMPRISING A SAMPLE-AND-HOLD DEVICE AND METHOD FOR SIGNAL PROCESSING IN A SAMPLE-AND-HOLD DEVICE

REFERENCE TO RELATED APPLICATIONS

This application claims the benefit of the priority date of German application DE 10 2006 014 925.4, filed on Mar. 30, 2006, the contents of which are herein incorporated by reference in their entirety.

FIELD OF THE INVENTION

The invention relates to a circuit arrangement comprising a sample-and-hold device, a method for signal processing in a sample-and-hold device, and also a use of the circuit arrangement.

BACKGROUND OF THE INVENTION

In many analog circuits, voltages are stored in capacitors or other charge stores. In this case, the stored voltages are often used for further signal processing. In this case, the charge stores may be formed as a switchable network of a plurality of partial charge stores.

Figure 4:
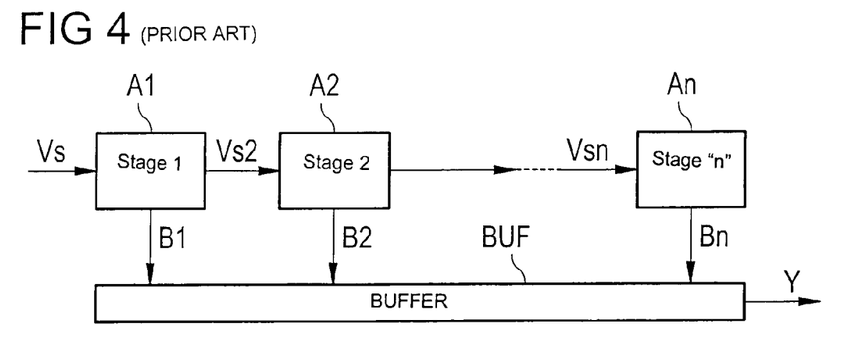
FIG. 4 shows an exemplary embodiment of an analog-to-digital converter.

The buffer storage of voltages for later further processing is used in analog-to-digital converters, for example. FIG. 4 shows one embodiment of an analog-to-digital converter with a pipeline architecture. The analog-to-digital converter shown for converting an analog input voltage Vs into a digital value Y comprises n cascaded stages A1, A2, . . . , An, which in each case generates a binary value B1, B2, . . . , Bn having one or more bits for the digital value Y and outputs it to a buffer BUF. In the buffer BUF, the binary values B1, B2, . . . , Bn are combined to form the digital value Y. In this case, the individual binary values B1, B2, . . . , Bn are generated temporally successively, the first stage A1 generating the binary value B1 from the voltage Vs present and outputting it to the buffer BUF. A result of the processing of the voltage signal Vs is output as voltage signal Vs2 to the second stage A2 for further processing. The voltage signal Vsn finally serves as an input signal for the last stage An.

Figure 5:
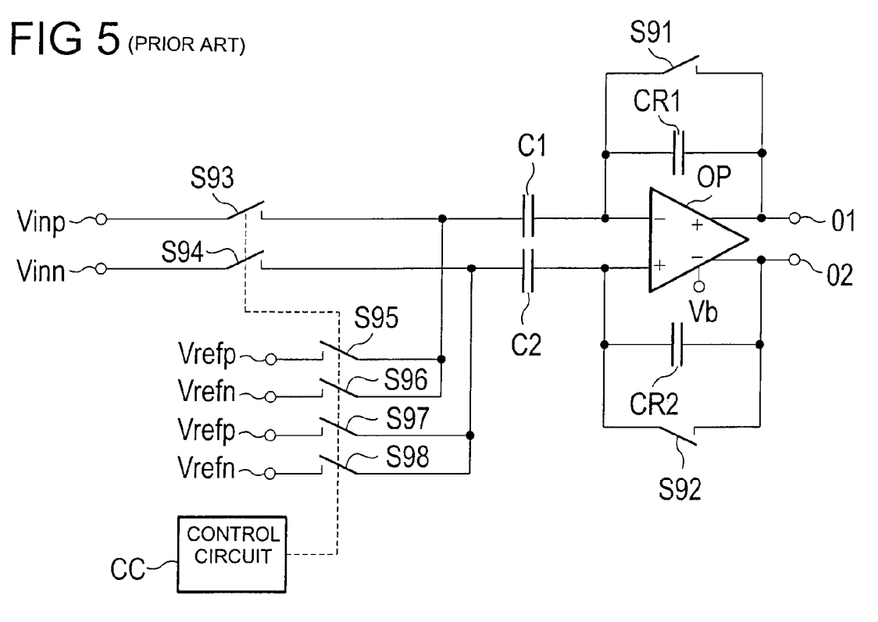
FIG. 5 shows an exemplary embodiment of a conventional sample-and-hold device.

FIG. 5 shows an exemplary embodiment of a conventional sample-and-hold device such as can be used in one of the stages A1 to An. The sample-and-hold device for processing differential input signals comprises input terminals Vinp and Vinn and also reference potential terminals Vrefp and Vrefn. The sample-and-hold device furthermore has capacitors C1, C2, which can be connected by first terminals to the input terminals Vinp, Vinn and the reference potential terminals Vrefp, Vrefn via switches S93 to S98. In this case, the switches S93 to S98 can be controlled by a control circuit CC. Second terminals of the capacitors C1, C2 are coupled to an inverting and a noninverting input of a differential amplifier OP. The noninverting output O1 of the differential amplifier OP is connected to the inverting input of the differential amplifier OP via a parallel circuit formed by a feedback capacitor CR1 and a switch S91. A parallel circuit formed by a feedback capacitor CR2 and a switch S92 is likewise connected between the inverting output O2 of the differential amplifier OP and its noninverting input.

One of the voltage signals Vs to Vsn can be fed in differential form via the input terminals Vinp, Vinn. In this case, the components of a signal at the input terminals Vinp, Vinn are complementary to one another with regard to a common mode potential. In a first phase, a sample phase, the switches S91, S92, S93, S94 are closed, while the switches S95, S96, S97, S98 are open. The capacitors C1, C2 are thereby charged in a manner corresponding to the input voltage.

In a subsequent phase, a hold phase, the switches S91, S92, S93, S94 are opened depending on a control by the control circuit. For example in a manner governed by a binary value, one of the capacitors C1, C2 is coupled to a first reference potential terminal Vrefp and the other is coupled to a second reference potential terminal Vrefn. In this case, reference potentials at the reference potential terminals Vrefp, Vrefn are usually likewise complementary to one another with regard to the reference voltage. As a result of the reference potentials being applied to the capacitors C1, C2, in a manner dependent on the switch position of the switches S95 to S98, a voltage can be added to the voltage stored in the capacitors C1, C2 or can be subtracted from the stored voltage. A result of this operation is output at the terminals O1, O2.

At the end of the hold phase, charges that are dependent on the stored voltages and the switch positions of the switches S95 to S98 are applied to the capacitors C1, C2. In a subsequent sample phase for storing new voltage values of the input voltage, the charge state of the capacitances C1, C2 can influence the sample operation. If a residual charge depends on a binary value from the analog-to-digital conversion, this may lead, particularly at high sampling rates, to so-called intersymbol interferences. Errors of this type impair the accuracy in the analog-to-digital conversion.

BRIEF DESCRIPTION OF THE DRAWINGS

The invention is explained in detail below using exemplary embodiments with reference to the drawings, in which.

DETAILED DESCRIPTION OF THE INVENTION

In the following description further aspects and embodiments of the present invention are summarized. In addition, reference is made to the accompanying drawings, which form a part hereof, and in which is shown by way of illustration, in which the invention may be practiced. The embodiments of the drawings present an exemplary disclosure in order to provide a better understanding of one or more aspects of the present invention. This disclosure is not intended to limit the features or key-elements of the invention to a specific embodiment. Rather, the different elements, aspects and features disclosed in the embodiments can be combined in different ways by a person skilled in the art to achieve one or more advantages of the present invention. It is to be understood that other embodiments may be utilized and structural or logical changes may be made without departing from the scope of the present invention. The elements of the drawing are not necessarily to scale relative to each other. Like reference numerals designate corresponding similar parts.

In one embodiment a circuit arrangement comprises a sample-and-hold device. The sample-and-hold device comprises a first, a second, a third and a fourth charge store, which in each case have a first and a second terminal. The sampleand-hold device furthermore comprises a first and a second input terminal for feeding in a differential input signal and also a first and a second output terminal and a first and a second reference potential terminal.

In this case, the first charge store is coupled in each case in connectable and disconnectable fashion via its first terminal to the first input terminal, to the first reference potential terminal and to the second reference potential terminal and is coupled to the first output terminal via its second terminal. The second charge store is coupled in each case in connectable and disconnectable fashion via its first terminal to the second input terminal, to the first reference potential terminal and to the second reference potential terminal, while its second terminal is coupled to the second output terminal.

The respective first terminal of the third and of the fourth charge store is coupled in each case in connectable and disconnectable fashion to the first input terminal, to the second input terminal, to the first reference potential terminal and to the second reference potential terminal. The respective second terminal of the third and of the fourth charge store is coupled in each case in connectable and disconnectable fashion to the first and to the second output terminal.

In one embodiment, the capacitances of the first, second, third and fourth charge store are substantially identical. Total identity of the capacitance value of a charge store cannot be guaranteed, however, on account of production-technological fluctuations. The charge stores can have a nominally identical capacitance in one embodiment, however, for example by virtue of substantially identical spatial dimensions.

As a result of the connectable and disconnectable couplings, which are embodied as switches, for example, the charge stores can be connected up differently in the circuit arrangement in different time segments, which correspond for example to clock periods of a sampling signal having a sampling frequency. By way of example, in a first time segment, the first and the third and also the second and the fourth charge store are in each case connected in parallel with one another. In a first phase, for example a sample phase, of the first time segment, the first and the third charge store can be connected in parallel between the first input terminal and the first output terminal, and the second and the fourth charge store can be connected in parallel between the second input terminal and the second output terminal. As a result, a first component of the input signal is applied to and charges the first and the third charge store, while a second component of the input signal is applied to and charges the second and the fourth charge store.

In a second phase, an evaluation or hold phase, the first and the third charge store can be connected between the first reference potential terminal and the first output terminal, and the second and the fourth charge store can be connected between the second reference potential terminal and the second output terminal. As an alternative, it is also possible for the first and the third charge store to be connected between the second reference potential terminal and the first output terminal, and for the second and the fourth charge store to be connected between the first reference potential terminal and the second output terminal. As a result, at the end of the second phase, the first and the third charge store are charged with a voltage that is different from the voltage with which the second and the fourth charge store were charged. The residual charge of the first and of the third charge store is therefore different from the residual charge of the second and of the fourth charge store.

In a first phase of a second time segment that directly succeeds the first time segment, the first and the fourth charge store can be connected in parallel between the first input terminal and the first output terminal. By contrast, the second and the third charge store are connected in parallel between the second input terminal and the second output terminal.

The first and the fourth and also the second and the third charge store in each case have different charges at the beginning of the first phase of the second time segment. This results in a charge equalization within the respective parallel circuit. The total charge of the first and of the fourth and also of the second and of the third charge store can therefore be equalized. As a result, the charge stores do not have to be subjected to charge reversal by the differential input signal. Consequently, the charging operation is independent of residual charges of preceding time segments. The occurrence of intersymbol interferences can thereby be reduced or cancelled.

It is also possible to feed in a differential input signal comprising components in which the second component is complementary to the first component with regard to a common mode potential. As a result, the respective residual charges are also complementary to one another. In a second phase of the second time segment, the charge store pairs formed in the first phase are coupled to the reference potential terminals in a manner analogous to that in the second phase of the first time segment. Consequently, the first and the fourth charge store have a residual charge that is for example complementary to the residual charge of the second and of the third charge store.

In a subsequent, third time segment, the charge stores can be connected up as in the first time segment again. Consequently, charge stores having complementary residual charges are again connected up to one another, so that the residual charges once again cancel each other out. Consequently, by virtue of the fact that, in each time segment, charge stores having preceding complementary residual charge are combined with one another, it is possible to reduce dependencies on preceding couplings in the sample-and-hold device and thus intersymbol interferences.

In a further embodiment, the circuit arrangement comprises a differential amplifier comprising an inverting input, which is coupled to the first output terminal, and a noninverting input, which is coupled to the second output terminal. The differential amplifier furthermore has an inverting and a noninverting output for outputting a differential output signal.

A first feedback charge store and, in parallel therewith, a first controlled switch may be connected between the inverting input and the noninverting output of the differential amplifier. A second feedback charge store and, in parallel therewith, a second controlled switch may likewise be connected between the noninverting input and the inverting output of the differential amplifier.

By means of the differential amplifier, the charges or voltages of the charge stores can be amplified and output as differential output signal for further processing. By way of example, the differential output signal may serve as an input signal for a further sample-and-hold device in an analog-to-digital converter with a pipeline architecture. The differential amplifier may also act in a function as a buffer, for example as a current buffer.

In another embodiment, the inverting and the noninverting output of the differential amplifier are coupled to the first and the second reference potential terminal. As a result, the circuit arrangement may be formed for example as a flip-around-sample-and-hold circuit.

Figure 1:
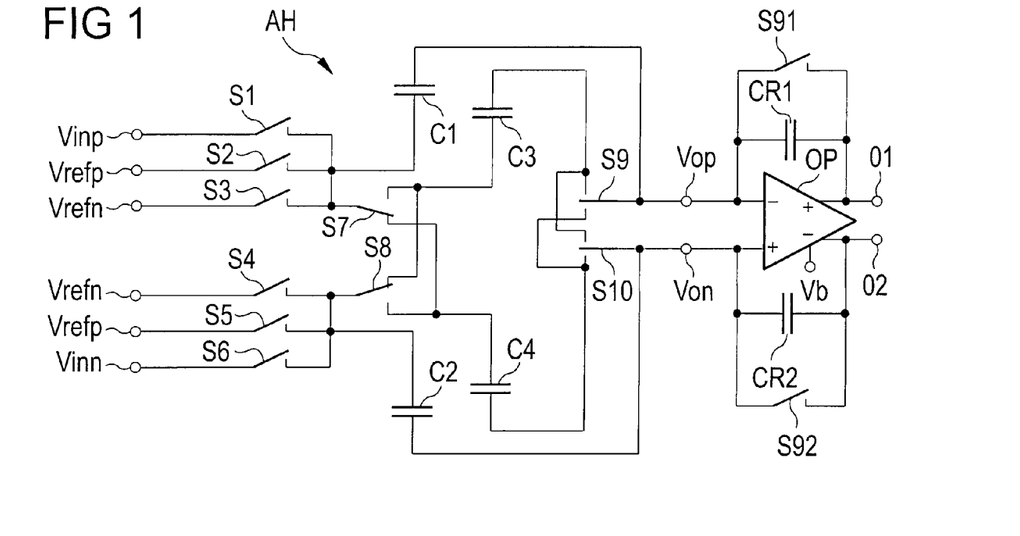
FIG. 1 shows a first exemplary embodiment of a circuit arrangement.

FIG. 1 shows an exemplary embodiment of a circuit arrangement which can be used, for example, in a stage of a multistage analog-to-digital converter as shown in FIG. 4. The circuit arrangement comprises a sample-and-hold device AH comprising a first, a second, a third and a fourth charge store C1, C2, C3, C4 and also switches S1 to S10. The first charge store C1 can be coupled via a switch S1 to a first input terminal Vinp, via a switch S2 to a first reference potential terminal Vrefp and via a switch S3 to a second reference potential terminal Vrefn. A second terminal of the charge store C1 is connected to a first output terminal Vop. The second charge store C2 can be coupled by its first terminal via the switch S4 to the second reference potential terminal Vrefn, via the switch S5 to the first reference potential terminal Vrefp and via the switch S6 to the second input terminal Vinn. A second terminal of the second charge store C2 is connected to the second output terminal Von. The third and the fourth charge store C3, C4 can be connected to the first and the second input terminal Vinp, Vinn and also the first and the second reference potential terminal Vrefp, Vrefn in a manner dependent on switch positions of the switches S1 to S8. Respective second terminals of the third and fourth charge stores C3, C4 can alternatively be coupled to the first or the second output terminal Vop, Von in a manner dependent on switch positions of the switches S9, S10.

A differential amplifier OP is connected by its inverting input to the first output terminal Vop and by its noninverting input to the second output terminal Von. A parallel circuit formed by a coupling charge store CR1 and a switch S91 is connected between a terminal O1 coupled to a noninverting output of the differential amplifier OP and the inverting input of the differential amplifier OP. In a similar manner, a parallel circuit formed by the feedback charge store CR2 and a switch S92 is connected between a second terminal coupled to the inverting output of the differential amplifier and the noninverting input of the differential amplifier OP.

A differential input signal comprising a first component and a second component, which is complementary to the first component with regard to a common mode potential, can be fed in at the input terminals Vinp, Vinn. Reference potentials at the reference potential terminals Vrefp, Vrefn are likewise complementary to one another with regard to the reference voltage. Sampling and processing of the differential input signal are effected in a respective time segment having a first phase, the sample phase, and a second phase, the hold phase. A time segment is formed for example by the clock period of a clock signal which determines a sampling frequency.

In the sample phase of a first time segment, the switches S1, S6, S91, S92 are closed, while switches S2, S3, S4, S5 are open. The switch position of the switches S7, S8, S9, S10 is chosen in such a way that the third charge store C3 is connected in parallel with the first charge store C1 and the fourth charge store C4 is connected in parallel with the second charge store C2. As a result, the first component of the differential input signal is applied jointly to the first and the third charge store C1, C3 and the second component of the differential input signal is applied jointly to the second and the fourth charge store C2, C4, whereby corresponding charging of the charge stores C1 to C4 occurs.

In the hold phase of the first time segment, the switches S1, S6, S91, S92 are opened, while the switch position of the switches S7, S8, S9, S10 remains unchanged. Either the switches S2 and S4 or the switches S3 and S5 are closed for example in a manner dependent on a binary value.

Usually, the reference potential at the first reference potential terminal Vrefp is higher than the common mode potential, while the reference potential at the second reference potential terminal Vrefn is lower than the common mode potential. If the switches S2 and S4 are closed in this case, this corresponds to an addition of the differential reference voltage formed by the first and second reference potential to the voltages stored on the charge stores C1, C2, C3, C4. The corresponding charge on the charge stores C1, C2, C3, C4 is amplified by the differential amplifier OP and output as a differential output voltage at the terminals O1, O2.

As a result of the switch positions chosen, at the end of the hold phase of the first time segment, the charges on the first and the third charge store C1, C3 are complementary to the charges on the second and the fourth charge store C2, C4.

In the sample phase of a second time segment directly succeeding the first time segment, the switches S1, S6, S91, S92 are closed again, while the switches S2, S3, S4, S5 are open. The switches S7, S8, S9, S10 are brought to a switch position which brings about a parallel connection of the first and the fourth charge store C1, C4 and also a parallel connection of the second and the third charge store C2, C3. As a result, charge stores which have a mutually complementary residual charge are in each case connected in parallel. This results in charge equalization between the charge stores of a parallel connection. Accordingly, the total charge of one of the parallel connections is independent of signal states or switch positions in a preceding time segment. The occurrence of intersymbol interferences is reduced.

In the sample phase of the second time segment, therefore, the charge stores C1, C4 are charged with the first component of the differential input signal and the charge stores C2, C3 are charged with the second component of the differential input signal. In the hold phase of the second time segment, the switch positions of the switches S7, S8, S9, S10 again remain unchanged, while the switches S1, S6, S91, S92 are opened. Either the switches S2 and S4 or the switches S3 and S5 are closed for example in a manner dependent on a further binary value, whereby an addition or a subtraction of reference voltage and voltage stored on the charge stores occurs. The charges of the first and the fourth charge store C1, C4 are now complementary to the charges of the second and third charge store C2, C3.

In a succeeding time segment, the first and the third and also the second and the fourth charge store are again connected in parallel with one another, whereby a charge ratio independent of signals or switch states is again brought about.

In an alternative embodiment, the differential amplifier OP can be omitted. In this case, it is only necessary to ensure that the output terminals Vop, Von, in the sample phase, are in each case at potentials which are identical or complementary with regard to the common mode potential. In the case of an identical potential, the output terminals Vop, Von are preferably at the common mode potential. The charge stores C1, C2, C3, C4 can in each case be formed by a capacitor or some other capacitive element, the capacitance of which is, in one embodiment, substantially identical in magnitude. As an alternative, each charge store can have a multiplicity of capacitors connected in parallel, for example, in which case the total capacitance of the charge stores C1, C2, C3, C4 is in each case intended to be identical in magnitude.

In one embodiment, the first and the second charge store are coupled in each case in connectable and disconnectable fashion via their respective first terminal to the first and to the second input terminal and also via their respective second terminal to the first and to the second output terminal.

By way of example, the first, second, third and fourth charge store are coupled via their respective first terminal to the first and the second input terminal and to the first and the second reference potential terminal and also via their respective second terminal to the first and the second output terminal in each case via at least one switch.

It is thereby possible to form, in each time segment, different combinations of charge stores to which can be applied as desired the first or the second component of the differential input signal and the voltages at the first and second reference potential terminal. In this case, it should be taken into consideration that, in each time segment, charge stores to which different voltages were applied in a temporally directly preceding time segment and which therefore have different residual charges are combined with one another by parallel connection.

A control circuit may be provided in one embodiment for controlling the switches of the circuit arrangement. A first and a second reference voltage can be fed to the first and the second reference potential terminal. The first and the second reference voltage should be complementary to one another with regard to the common mode potential. As a result, according to the reference potential terminal to which charge stores of the respective second phase are coupled, reference voltages can be added to or subtracted from the voltages stored in the respective first phase.

Figure 2:
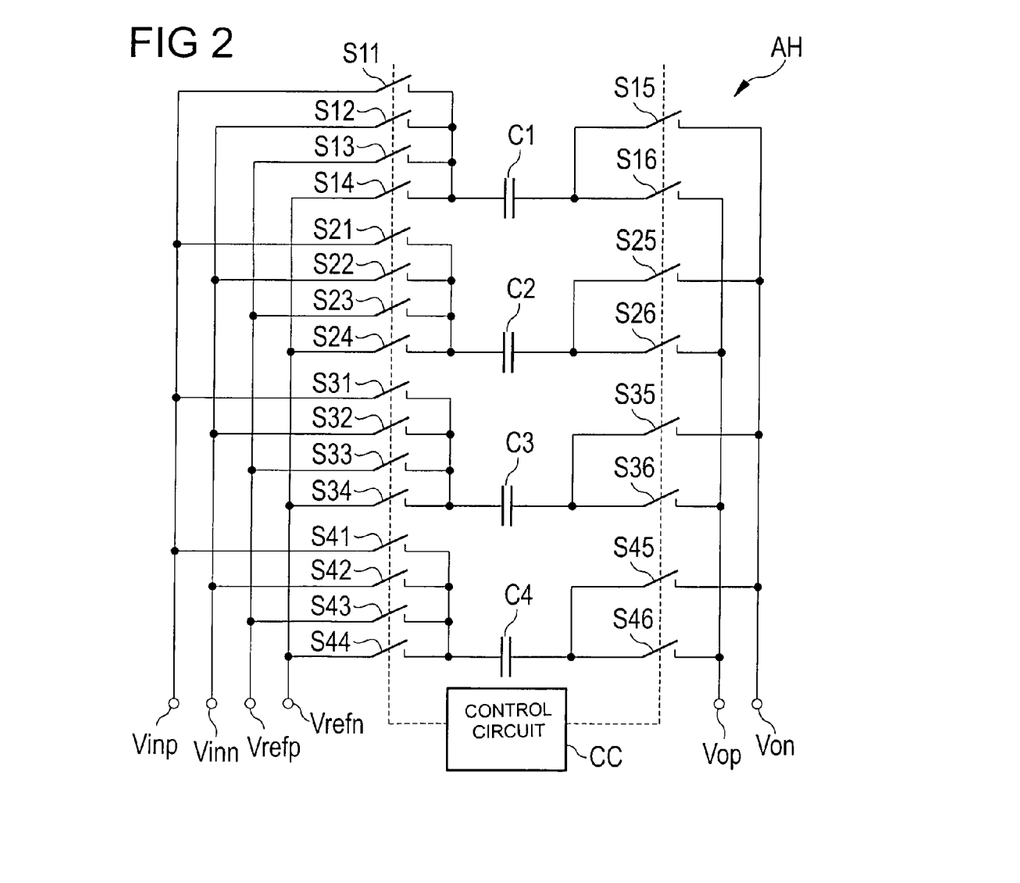
FIG. 2 shows a second exemplary embodiment of a circuit arrangement.

FIG. 2 shows a second exemplary embodiment of a circuit arrangement. In this case, components that are identical in terms of their function or effect bear identical reference symbols. The sample-and-hold device AH comprises the first, second, third and fourth charge store C1, C2, C3, C4. These are coupled at their first terminal via switches to the first and second input terminal Vinp, Vinn and also the first and second reference potential terminal Vrefp, Vrefn. The second terminals are in each case coupled via switches to the output terminals Vop, Von. For this purpose, the switches S11, S12, S13, S14, S15, S16 are connected to the first charge store C1, the switches S21, S22, S23, S24, S25, S26 are connected to the second charge store C2, the switches S31, S32, S33, S34, S35, S36 are connected to the third charge store C3, and the switches S41, S42, S43, S44, S45, S46 are connected to the fourth charge store C4. A switch position of the switches can be controlled by means of a control circuit CC.

In a first phase of a time segment, in each case two charge stores in a first combination are coupled to the first input terminal Vinp and two charge stores in a second combination are coupled to the second input terminal Vinn. As a result, the first combination is charged with the first component of the differential input signal and the second combination is charged with the second component of the differential input signal. In a second phase of the time segment, the switches are actuated in such a way that one of the combinations from the first phase is coupled to the first reference potential terminal Vrefp and the other combination is coupled to the second reference potential terminal Vrefn. The output-side switches remain unchanged in this case. When forming the combinations, it should be taken into consideration that the charge stores which are combined were charged complementarily with respect to one another in a preceding time segment, in order to ensure the compensation of the residual charges that is advantageous for the reduction of the intersymbol interferences. The control circuit CC is for example part of an analog-to-digital converter which, through control of the switches, applies reference voltages to the charge stores in order to generate a residual voltage or residue voltage for a next stage in a pipeline architecture such as is shown in FIG. 4, for example. An addition or a subtraction of the reference voltage is optionally possible by means of a corresponding switch position.

Consequently, with the four charge stores C1, C2, C3, C4, six combinations of in each case two charge stores are possible, as also shown in table 1. Table 1 shows possible combinations of the charge stores C1, C2, C3, C4 in temporally successive time segments 1 to 6. In this case, the switch positions should be chosen in such a way that a charge store is arranged either in a first combination P1 for application of the first component of the differential input signal or in a combination P2 for application of the second component.

TABLE 1

| Time segment | C1 | C2 | C3 | C4 |
|---|---|---|---|---|
| 1 | P1 | P1 | P2 | P2 |
| 2 | P1 | P2 | P1 | P2 |
| 3 | P1 | P2 | P2 | P1 |
| 4 | P2 | P2 | P1 | P1 |
| 5 | P2 | P1 | P2 | P1 |
| 6 | P2 | P1 | P1 | P2 |

By way of example, in a first time segment, the first and the second charge store C1, C2 are arranged in the first combination P1, while the third and the fourth charge store are arranged in the second combination P2. The charges of the first and of the second charge store C1, C2 are thus complementary to the charges of the third and of the fourth charge store C3, C4. In the second time segment, a new first combination is formed from the first charge store C1 and the third charge store C3, that is to say a combination of charge stores having complementary residual charges. The second and the fourth charge stores C2, C4 in the second combination P2 likewise have mutually complementary charges. The charge stores in the combinations are varied in such a way that charge carriers having complementary residual charges are combined in each time segment.

In one embodiment the combinations of a seventh time segment, which is not shown here, correspond to the combinations of the first time segment, that is to say that the six time segments shown in table 1 are periodically repeated.

Table 1 shows only an exemplary sequence of time segments. The order of the time segments can be varied as desired as long as combinations of charge stores having complementary residual charges are always formed.

If the capacitances of the charge stores are not totally identical, that is to say the charge stores have slight deviations caused by production, for example, the charges on the charge stores at the end of a time segment are not totally identical and therefore not completely complementary to one another. In the combination in the next time segment, complete charge equalization is not effected, therefore, which may have small effects on the charging operation with the input signal. Through arbitrary combinations of the charge stores, as shown in table 1 in conjunction with FIG. 2, however, these effects can cancel each other out on average over time. This is also referred to as dynamic element matching. This leads to a further reduction of intersymbol interferences.

In a further embodiment, the sample-and-hold device comprises further charge stores, the capacitances of which are substantially identical. In this case, an identical number of charge stores of the further charge stores can be connected in parallel with each of the first, second, third and fourth charge stores. By way of example, a charge store may comprise a plurality of parallel-connected charge stores or capacitors. However, the further charge stores may also be connected up to form a switchable charge store network. When connecting the first to fourth and the further charge stores in parallel, it should in each case be taken into consideration that the total capacitances of the parallel connections for the first and the second component of the differential input signal are approximately identical in magnitude and that charge stores having different, for example complementary, residual charges are combined in order to reduce the intersymbol interferences.

Figure 3:
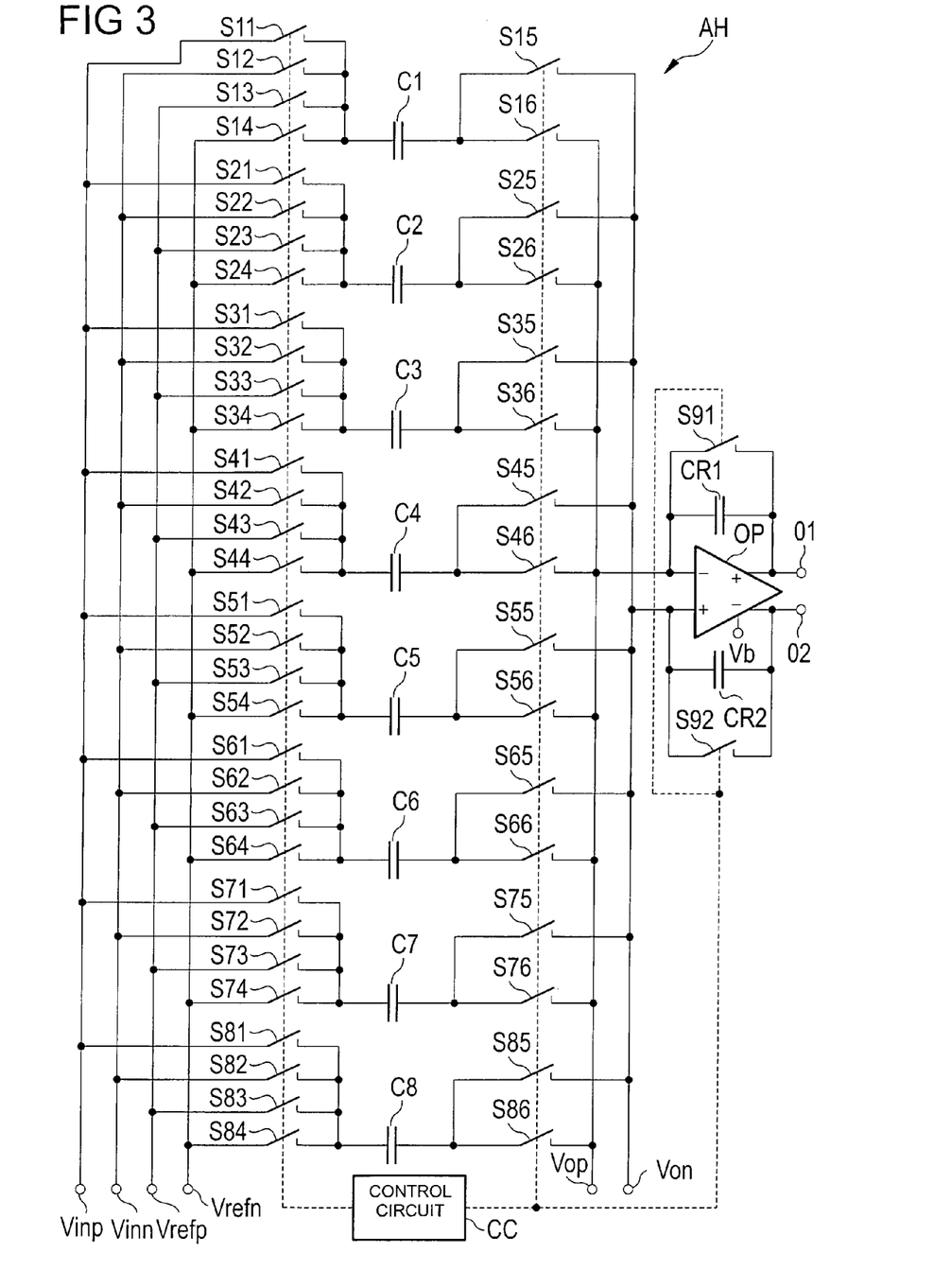
FIG. 3 shows a third exemplary embodiment of a circuit arrangement.

FIG. 3 shows a third exemplary embodiment of a circuit arrangement. In addition to the charge stores and switches shown in FIG. 2, the sample-and-hold device AH comprises a fifth, sixth, seventh and eighth charge store C5, C6, C7, C8. In this case, the further charge stores C5, C6, C7, C8 are likewise coupled via switches to the input terminals Vinp, Vinn, the reference potential terminals Vrefp, Vrefn and the output terminals Vop, Von. A differential amplifier for amplifying the differential output signal is connected to the output terminals Vop, Von, as shown in FIG. 1.

The common mode potential for the differential signals can be fed to the differential amplifier OP via a common mode potential terminal Vb. The common mode potential may simultaneously correspond to the common mode voltage of the differential amplifier OP or the circuit arrangement.

The switches S51 to S56, S61 to S66, S71 to S76 and S81 to S86 are also driven by means of the control circuit CC. The switches S91, S92 are in turn controlled by means of the control circuit CC.

Here in one embodiment four charge carriers or all eight charge carriers C1 to C8 may have the same capacitance. If the eight charge carriers have the same capacitance, in the different time segments combinations of in each case four charge stores are formed, of which one is charged with the first component of the input signal and the other is charged with the second component of the input signal at the input terminals Vinp, Vinn. When a new combination is formed in a next time segment, the total charge of the charge stores is intended to be equalized. This is achieved by exchanging half, that is to say 50%, of the charge stores in a respective combination. In the case of eight charge stores, therefore, in each case two charge stores from one combination are exchanged with two charge stores from the other combination. As a result of the equalized total charge, this leads to the desired reduction of the intersymbol interferences.

If in each case four charge stores have the same capacitance, it is possible to form variations of the first four identical charge stores in a first and a second combination and of the second four charge stores in a third and a fourth combination. Here, too, in each case half of the charge carriers are exchanged between the first and the second combination and also between the third and the fourth combination. The formation of first, second, third and fourth combinations is also possible for eight charge stores having an identical capacitance. Consequently, combinations having complementarily precharged charge stores are formed in each case. The dependence of a sample operation in a sample phase on the past is thereby reduced.

If the first component of the input signal is applied to the first and to the third combination and the second component of the input signal is applied to the second and fourth combination in the sample phase, it is also possible, for example, for the reference voltage at the first reference potential terminal Vrefp to be applied to the first and the fourth combination and the second reference voltage at the second reference potential terminal Vrefn to be applied to the second and third combination in the hold phase. It is thereby possible to realize different arithmetic operations with the reference voltages in the hold phase. When forming the combinations, however, it should be taken into consideration that mutually complementary reference voltages were applied to the charge stores of new combinations.

By virtue of the various combination possibilities, dynamic element matching can also be carried out in the circuit arrangement according to FIG. 3 in the event of slight deviations of the capacitance values of the charge stores C1 to C8 from their nominal value. Consequently, the effects on the charging operation due to incompletely equalized residual charges can be disregarded on average over time.

In a further embodiment a circuit arrangement comprises a sample-and-hold device, in which the sample-and-hold device comprises a first, a second, a third and a fourth charge store. In addition, the sample-and-hold device has a first and a second input terminal for feeding in a differential input signal comprising a first and a second component, and also a first and a second output terminal for outputting a differential output signal. A control circuit is additionally provided, which is set up for connecting up the first, second, third and fourth charge store to the first and second input terminal and also the first and second output terminal in such a way that in a first phase of a first time segment, the first and the third charge store are charged with the first component and the second and the fourth charge store are charged with the second component. In a second phase of the first time segment, the control circuit has the effect that the differential output signal is generated in a manner dependent on charges of the first, second, third and fourth charge store.

In a first phase of a second time segment, the control circuit has the effect that the first and the fourth charge store are charged with the first component and the second and the third charge store are charged with the second component. In a manner dependent on the charges of the first, second, third and fourth charge store, the differential output signal is generated in a second phase of the second time segment. In this case, the first and the second time segment may temporally alternately succeed one another. During the generation of the differential output signal in the second phase of the first time segment, for example the voltage which results from the charge of the first and third charge store, as well as the voltage which results from the charge of the second and fourth charge store, are evaluated and processed further. The charges of the first and third charge store are different from the charges of the second and fourth charge store. As a result, the respective residual charges cancel each other out in the first phase of the second time segment during the charging of the first and fourth and also of the second and third charge store. Charging operations in first phases of time segments are therefore in each case independent of the charges of preceding time segments.

The capacitances of the first, second, third and fourth charge store may be substantially identical in one embodiment. Furthermore, the first and the second time segment may temporally alternately succeed one another. It is once again possible to feed in a differential input signal comprising components in which the second component is complementary to the first component with regard to a common mode potential. As a result, the respective residual charges are also complementary to one another.

In one embodiment, the control circuit has the effect that in a respective first phase of further time segments, a respective first combination of two charge stores of the first, second, third and fourth charge store is charged with the first component, while a respective second combination of two charge stores of the first, second, third and fourth charge store is charged with a second component. In this case, the charge stores of the first combination and the charge stores of the second combination were in each case charged with mutually complementary components of the differential input signal in a temporally directly preceding time segment. The control circuit additionally has the effect that in a respective second phase of the further time segments, the differential output signal is generated in a manner dependent on the charges of the first, second, third and fourth charge store.

Any desired combinations of the four charge stores are thereby possible, where in each case two of the first, second, third and fourth charge stores form a combination. In each time segment, two charge stores which were charged with different, for example mutually complementary, voltages in the directly preceding time segment, that is to say for example in a sample period, and thereby have a different residual charge are in each case combined. The residual charges are cancelled out when the charge stores are combined, as a result of which a charging in the respective first time segment is independent of preceding charges.

In one embodiment the circuit arrangement may comprise a differential amplifier for the differential amplification of the differential output signal. Furthermore, the sample-and-hold device may have a first and a second reference potential terminal for feeding in a first and a second reference voltage. In this case, in the second phases of the time segments, the charge stores can be coupled to the first and the second reference potential terminal for the purpose of applying the first or the second reference voltage to the charge stores.

In this case, the reference voltages should be complementary to one another with regard to the common mode potential. A voltage addition to or a voltage subtraction from the voltages stored on the charge stores can be effected as a result of the reference voltages being applied to the charge stores. The differential output signal produced from the result of this arithmetic operation can then be directly processed further or be amplified by the differential amplifier.

In a further embodiment, the sample-and-hold device comprises a number of further charge stores corresponding to an integral multiple of four. In this case, the control circuit is set up for connecting up the further charge stores to the first and second input terminal and also the first and second output terminal in such a way that in the first phase of one of the time segments, a respective third combination of an even number of charge stores of further charge stores is charged with the first component of the differential input signal. The control circuit furthermore has the effect that in the first phase of one of the time segments, a respective fourth combination of an even number of charge stores of the further charge stores is charged with the second component of the differential input signal. In this case, the charge stores of the third combination and the charge stores of the fourth combination should in each case be charged with mutually complementary components of the differential input signal in a temporally directly preceding time segment. In the second phase of one of the time segments, the differential output signal is also generated in a manner dependent on charges of the further charge stores.

The further charge stores may likewise have a substantially identical capacitance, that is to say nominally match in terms of their capacitance. The first or the second component of the differential input signal can be applied to a charge store in a time segment only in each case in the third or the fourth combination. As a result, it is possible to construct a network of charge stores whose combination can be varied as desired. In this case, voltages are applied to the third combination together with the first combination, and the fourth combination together with the second combination. The total capacitance from first and third combination is intended in one embodiment to be equal to the total capacitance from second and fourth combination. Consequently, a reduction of intersymbol interferences is achieved.

A circuit arrangement according to one of the embodiments described may be used in an analog-to-digital converter, for example.

In an embodiment of a method for signal processing in a sample-and-hold device, a first, a second, a third and a fourth charge store are provided. In a first phase of a first time segment, the first and the third charge store are charged with a first component of a differential input signal and the second and the fourth charge store are charged with a second component of the differential input signal. In a second phase of the first time segment, a differential output signal is generated in a manner dependent on charges of the first, second, third and fourth charge store. In a first phase of a second time segment, the first and the fourth charge store are charged with the first component of the differential input signal and the second and the third charge store are charged with the second component of the differential input signal. In a second phase of the second time segment, the differential output signal is generated in a manner dependent on the charges of the first, second, third and fourth charge store. In this case, the first and the second time segment can temporally alternately succeed one another.

What is achieved by the different charging of the charge stores in different time segments is that charge stores which were charged differently than one another in a preceding time segment are charged together. By virtue of the different residual charges that cancel each other out, charging operations are possible which are not based on a history of preceding charging operations. Intersymbol interferences can thereby be reduced.

In one embodiment the first, second, third and fourth charge stores may be provided with substantially identical capacitance. In one embodiment, the first and the second component of the differential input signal are complementary to one another with regard to a common mode potential.

In a further embodiment of a signal processing method, in a respective first phase of further time segments, a respective first combination of two charge stores of the first, second, third and fourth charge store is charged with the first component of the differential input signal; and a respective second combination of two charge stores of the first, second, third and fourth charge store is charged with the second component of the differential input signal.

In this case, the charge stores of the first combination and the charge stores of the second combination are in each case charged with different components of the differential input signal in a temporally directly preceding time segment. In a respective second phase of the further time segments, the differential output signal is generated in a manner dependent on the charges of the first, second, third and fourth charge store. As a result, from the available charge stores it is possible to form any desired combinations which are charged with the components of the differential input signal. When choosing the combinations, it should be taken into consideration in one embodiment that charge stores having different residual charges are combined which make the total charge of a combination independent of preceding charging operations.

In another embodiment of a signal processing method, a number of further charge stores is provided which corresponds to an integral multiple of four. In a first phase of one of the time segments, a respective third combination of an even number of charge stores of the further charge stores is charged with the first component of the differential input signal. A respective fourth combination of an even number of charge stores of the further charge stores is charged with the second component of the differential input signal in this first phase of said one of the time segments. In this case, the charge stores of the third combination and the charge stores of the fourth combination are intended to be charged in each case with different, for example mutually complementary, components of the differential input signal in a temporally directly preceding time segment. In the second phase of said one of the time segments, the differential output signal is also generated in a manner dependent on charges of the further charge stores.

Charge store networks can be formed by means of the further charge stores. In the case of the further charge stores, in each case four charge stores should have a substantially identical capacitance in one embodiment. Likewise, when forming the third and fourth combination, it should be taken into consideration that the total capacitance of the third and the fourth combination is in each case identical in magnitude. This ensures that in the case of different variations of charge stores in the third and fourth combination, it is possible to combine charge stores having mutually complementary residual charges. Intersymbol interferences are therefore reduced.

In a further embodiment of a signal processing method, the differential output signal can be differentially amplified. Moreover, during the differential amplification in a respective time segment a first reference voltage is applied to the charge stores which are charged with the first component of the differential input signal in the respective time segment while a second reference voltage may be applied to the charge stores which are charged with the second component of the differential input signal in the respective time segment.

This enables an addition or subtraction of voltages with the voltages stored on the charge carriers.

The charge stores may be provided as capacitors.

Even though the invention has been illustrated on the basis of various embodiments of an analog-to-digital converter, the embodiments can be applied to all differential circuits comprising switched charge stores, or switched capacitor circuits, the charge stores in each case being arranged differentially. In the analog-to-digital conversion, the proposed principle can also be used in successive approximation architectures besides the pipeline architecture.

Circuits comprising switches S91, S92 in the feedback path of a differential amplifier OP have been shown hitherto. In a further class of switched capacitor circuits, the flip-around-sample-and-hold circuits, the switches are not required. Instead, switches are provided which, in an evaluation phase, connect the respective first terminals of the charge stores to a reference potential, for example to the output terminals of the differential amplifier OP. In this case, the output terminals of the differential amplifier OP form the reference potential terminals. The proposed principle shown in the various embodiments can therefore be applied to these circuits as well.

In comparison with a conventional sample-and-hold device as shown in FIG. 5, for example, twice as many charge stores are employed in accordance with the presented embodiments. However, the capacitance of the charge stores can be reduced by half since at least two charge stores are operated in parallel and, consequently, the total capacitance of the parallel circuit corresponds to the capacitance of the charge store in the conventional sample-and-hold device. By virtue of the reduced capacitance of an individual charge store in the embodiments presented, the size of the charge store decreases as well, so that the space requirement of two charge stores having half the capacitance corresponds approximately to that of one charge store having the full capacitance. The space requirement of the charge stores of the circuit arrangement according to one of the embodiments therefore corresponds approximately to the space requirement of the charge stores in a conventional sample-and-hold device. Consequently, no additional power loss is generated.

An increase in the number of the charge stores therefore essentially corresponds to the decomposition of a charge store into two components having an identical capacitance in one embodiment. Since the total capacitance of a parallel circuit in accordance with the embodiments shown is not greater than the capacitance of a charge store that is conventionally used, the current loading for charging the charge stores is not increased either. The source which provides the input signal therefore does not have to drive any more load than for a conventional sample-and-hold device.

Although specific embodiments have been illustrated and described herein, it will be appreciated by those of ordinary skill in the art, that any arrangement which is calculated to achieve the same purpose may be substituted for the specific embodiments shown. It is to be understood, that the above description is intended to be illustrative and not restrictive. This application is intended to cover any adaptations or variations of the invention.

Combinations of the above embodiments and many other embodiments will be apparent to those of skill in the art upon reading and understanding the above description. The scope of the invention includes any other embodiments and applications in which the above structures and methods may be used. The scope of the invention should, therefore, be determined with reference to the appended claims along with the scope of equivalents to which such claims are entitled.

It is emphasized that the Abstract is provided to comply with 37 C.F.R. section 1.72(b) requiring an abstract that will allow the reader to quickly ascertain the nature and gist of the technical disclosure. It is submitted with the understanding, that it will not be used to interpret or limit the scope or meaning of the claims.

The invention claimed is:

1. A circuit arrangement comprising a sample-and-hold device, the sample-and-hold device comprising:
   a first, a second, a third and a fourth charge store, which in each case have a first and a second terminal;
   a first and a second input terminal configured to receive a differential input signal;
   a first and a second output terminal;
   a first and a second reference potential terminal configured to receive a first and second reference potential, respectively;
   wherein the first charge store comprises a first terminal selectively coupled to the first input terminal, the first reference potential terminal, and the second reference potential terminal, and comprising a second terminal coupled to the first output terminal;
   wherein the second charge store comprises a first terminal selectively coupled to the second input terminal, the first reference potential terminal, and the second reference potential terminal, and comprising a second terminal coupled to the second output terminal; and
   wherein the third and the fourth charge stores each comprise a first terminal selectively coupled to the first input terminal, the second input terminal, the first reference potential terminal and the second reference potential terminal, and each comprise a second output terminal coupled to the first and the second output terminal, respectively.

2. The circuit arrangement of claim 1, wherein a capacitance of the first, second, third and fourth charge stores are substantially identical.

3. The circuit arrangement of claim 1, wherein the differential input signal comprises a first component and a second component, wherein the second component is complementary to the first component with regard to a common mode potential, and wherein the first and second components are provided to the first and the second input terminals, respectively.

4. The circuit arrangement of claim 1, wherein the first terminals of the first and the second charge stores are selectively coupled to the first and the second input terminals, respectively, and the second terminals thereof are coupled to the first and the second output terminals, respectively.

5. The circuit arrangement of claim 1, wherein the first, second, third and fourth charge stores are coupled via their respective first terminals to one of the first and second input terminals and the first and second reference potential terminals, and also via their respective second terminals to one of the first and the second output terminals via a switching network.

6. The circuit arrangement of claim 1, wherein the sample-and-hold device comprises further charge stores, the capacitances of which are substantially identical, wherein an identical number of charge stores of the further charge stores are selectively connected in parallel with each of the first, second, third and fourth charge stores.

7. The circuit arrangement of claim 1, further comprising a control circuit configured to control the selective coupling of the charge stores.

8. The circuit arrangement of claim 1, further comprising a differential amplifier, comprising:
   an inverting input coupled to the first output terminal;
   a noninverting input coupled to the second output terminal; and
   an inverting and a noninverting output configured to output a differential output signal.

9. The circuit arrangement of claim 8, further comprising:
   a first feedback charge store and in parallel therewith a first controlled switch connected between the inverting input and the noninverting output of the differential amplifier; and
   a second feedback charge store and in parallel therewith a second controlled switch connected between the noninverting input and the inverting output of the differential amplifier.

10. The circuit arrangement of claim 1, further comprising a first and a second reference voltage fed to the first and the second reference potential terminals, respectively.

11. The circuit arrangement of claim 8, wherein the inverting and the noninverting output of the differential amplifier are coupled to the first and the second reference potential terminals, respectively.

12. A sample-and-hold circuit, comprising:
   first, second, third and fourth charge stores;
   a switching network, operably coupled to the charge stores; and
   a control circuit configured to control the switching network to effectuate a first sample configuration and a first hold configuration in a first time segment, and a second sample configuration and a second hold configuration in a second time segment, wherein the first and second sample configurations are different from one another;
   wherein in the first sample configuration the first and third charge stores are connected together in parallel, and receive a first part of a differential signal, and the second and fourth charge stores are connected in parallel, and receive a second part of a differential signal.

13. The sample-and-hold circuit of claim 12, wherein the second sample configuration is operable to provide charge equalization between the respective charge stores.

14. The sample-and-hold circuit of claim 12, wherein in the second sample configuration the first and fourth charge stores are connected in parallel, and receive the first part of the differential signal, and the second and third charge stores are connected in parallel, and receive the second part of the differential signal.

15. The sample-and-hold circuit of claim 12, wherein in the first hold configuration the first and third charge stores are connected to a first reference potential, and the second and fourth charge stores are connected to a second reference potential, and wherein the first and second reference potentials are complementary with respect to a common node potential.

16. A circuit arrangement comprising a sample-and-hold device, the sample-and-hold device comprising:
   a first, a second, a third and a fourth charge store;
   a first and a second input terminal for feeding in a differential input signal comprising a first and a second component, respectively;
   a first and second output terminal configured to output a differential output signal;
   a control circuit configured to selectively connect the first, second, third and fourth charge stores to one of the first and second input terminals and also one of the first and second output terminals in such a way that:
      in a first phase of a first time segment, the first and the third charge stores are charged with the first component and the second and the fourth charge stores are charged with the second component;
      in a second phase of the first time segment, the differential output signal is generated in a manner dependent on charges of the first, second, third and fourth charge stores;
      in a first phase of a second time segment, the first and the fourth charge stores are charged with the first component and the second and the third charge stores are charged with the second component; and
      in a second phase of the second time segment, the differential output signal is generated in a manner dependent on the charges of the first, second, third and fourth charge stores.

17. The circuit arrangement of claim 16, wherein capacitances of the first, second, third and fourth charge stores are substantially identical.

18. The circuit arrangement of claim 16, wherein the first and the second component of the differential input signal are complementary to one another with regard to a common mode potential.

19. The circuit arrangement of claim 16, wherein the first and the second time segment temporally alternately succeed one another.

20. The circuit arrangement of claim 16, wherein the control circuit is configured to connect, in a respective first phase of further time segments, the first, second, third and fourth charge stores to one of the first and second input terminals and also to one of the first and second output terminals in such a way that:
   a respective first combination of two charge stores of the first, second, third and fourth charge stores is charged with the first component; and
   a respective second combination of two charge stores of the first, second, third and fourth charge stores is charged with the second component;
   wherein the charge stores of the first combination and the charge stores of the second combination are in each case charged with different components of the differential input signal in a temporally directly preceding time segment; and
   wherein in a respective second phase of the further time segments, the differential output signal is generated in a manner dependent on the charges of the first, second, third and fourth charge stores.

21. The circuit arrangement of claim 16, wherein the sample-and-hold device comprises a first and a second reference potential terminal configured to receive a first and a second reference voltage, respectively, wherein the control circuit is configured to couple the charge stores to the first or the second reference potential terminal in the second phases of the time segments for the purpose of selectively applying the first or the second reference voltage to the charge stores.

22. A method for signal processing in a sample-and-hold device, comprising:
provision of a first, a second, a third and a fourth charge store;
charging in a first phase of a first time segment the first and the third charge stores with a first component of a differential input signal and the second and fourth charge stores with a second component of the differential input signal;
generating a differential output signal in a second phase of the first time segment in a manner dependent on charges of the first, second, third and fourth charge stores;
charging in a first phase of a second time segment the first and the fourth charge stores with the first component of the differential input signal, and the second and the third charge stores with the second component of the differential input signal; and
generating the differential output signal in a second phase of the second time segment in a manner dependent on the charges of the first, second, third and fourth charge stores.

23. The method of claim 22, wherein the first and the second time segments temporally alternately succeed one another.

24. The method of claim 22, wherein the first, second, third and fourth charge stores are provided with substantially identical capacitance.

25. The method of claim 22, wherein the first and the second components of the differential input signal are complementary to one another with regard to a common mode potential.

26. The method of claim 22, wherein, in a respective first phase of further time segments:
charging a respective first combination of two charge stores of the first, second, third and fourth charge stores with the first component of the differential input signal;
charging a respective second combination of two charge stores of the first, second, third and fourth charge stores with the second component of the differential input signal;
wherein the charge stores of the first combination and the charge stores of the second combination are in each case charged with different components of the differential input signal in a temporally directly preceding time segment; and
wherein in a respective second phase of the further time segments, the differential output signal is generated in a manner dependent on the charges of the first, second, third and fourth charge stores.

* * * * *